(12) United States Patent
Jia et al.

(10) Patent No.: US 6,743,292 B2
(45) Date of Patent: Jun. 1, 2004

(54) ORIENTED CONDUCTIVE OXIDE ELECTRODES ON $SiO_2$/SI AND GLASS

(75) Inventors: Quanxi Jia, Los Alamos, NM (US); Paul N. Arendt, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/955,715

(22) Filed: Sep. 18, 2001

(65) Prior Publication Data

US 2002/0031686 A1 Mar. 14, 2002

Related U.S. Application Data

(62) Division of application No. 09/320,398, filed on May 26, 1999, now Pat. No. 6,312,819.

(51) Int. Cl.$^7$ .......................... C30B 29/00; C30B 25/02
(52) U.S. Cl. ..................... 117/108; 117/103; 117/108; 117/902; 117/905; 427/595; 427/596
(58) Field of Search ................. 427/595, 596, 427/581, 585; 117/902, 905, 103, 108

(56) References Cited

U.S. PATENT DOCUMENTS

| | | | | |
|---|---|---|---|---|
| 5,248,564 A | * | 9/1993 | Ramesh et al. | 328/688 |
| 5,270,298 A | | 12/1993 | Ramesh | 505/1 |
| 5,432,151 A | * | 7/1995 | Russo et al. | 505/474 |
| 5,519,235 A | | 5/1996 | Ramesh | 257/295 |
| 5,741,377 A | * | 4/1998 | Goyal et al. | 148/512 |
| 5,872,080 A | * | 2/1999 | Arendt et al. | 505/702 |
| 5,898,020 A | * | 4/1999 | Goyal et al. | 505/239 |

OTHER PUBLICATIONS

Jia, Q.X. et al., "Deposition of epitaxial yttria–stabilized zirconia on single crystal Si and subsequent growth of an amorphous SiO2 interlayer", Philposphoical Magazine letters, vol. 72, No. 6 pp. 385–391, no Date.*

Jia, Q.X. et al., "Epitaxial growth of highly conductive RuO2 thin films on (100) Si", Appl. Phys. Lett. 68 (8) pp 1069–1071 (Feb. 16, 1996).*

Wu, X.D. et al., "Epitaxial CeO2 films as buffer layers for high temperature superconduting thin films", Appl. Phys. Lett. 58(19) pp. 2165–2167 (May 1991).*

Jia, Q.X. et al., "Biaxially Oriented Conductive La0.5Sr0.5CoO3 Thin Films on SiO2/Si" J. of Vac. Sci. Technol. A, 16 (3), pp. 380–1383( May/Jun. 1998).*

Jia et al., "Biaxially Oriented Conductive $La_{0.5}Sr_{0.5}CoO_3$ Thin Films On $SiO_2$/Si," J. of Vac. Sci. Technol. A, 16(3), pp. 1380–1383, (May/Jun. 1998).

Jia et al., "Role of Yttria–Stabilized Zirconia Produced By Ion–Beam–Assisted Deposition On The Properties of $RuO_2$ on $SiO_2$/Si," J. Mater. Res., vol. 13, No. 9, pp. 2461–2464 (Sep. 9, 1998).

Ramesh et al., "Ferroelectric La–Sr–Co–O/Pb–Zr–Ti–O/ La–Sr–Co–O Heterostructures On Silicon Via Template Growth," Appl. Phys. Lett. 63 (26), pp. 3592–3594, (Dec. 27, 1993).

(List continued on next page.)

Primary Examiner—Stephen Stein
(74) Attorney, Agent, or Firm—Bruce H. Cottrell (57) ABSTRACT

A thin film structure is provided including a silicon substrate with a layer of silicon dioxide on a surface thereof, and a layer of cubic oxide material deposited upon the layer of silicon dioxide by ion-beam-assisted-deposition, said layer of cubic oxide material characterized as biaxially oriented. Preferably, the cubic oxide material is yttria-stabilized zirconia. Additional thin layers of biaxially oriented ruthenium oxide or lanthanum strontium cobalt oxide are deposited upon the layer of yttria-stabilized zirconia. An intermediate layer of cerium oxide is employed between the yttria-stabilized zirconia layer and the lanthanum strontium cobalt oxide layer. Also, a layer of barium strontium titanium oxide can be upon the layer of biaxially oriented ruthenium oxide or lanthanum strontium cobalt oxide.

1 Claim, 10 Drawing Sheets

OTHER PUBLICATIONS

Jia et al., "Oriented Conductive Oxide Electrodes on $SiO_2$/Si," Integrated Ferroelectrics, vol. 21, pp. 397–406 (1998) no month.

Dat et al., "Polycrystalline $La_{0.5}Sr_{0.5}CoO_3$/$PbZr_{0.53}Ti_{0.47}O_3$/$La_{0.5}Sr_{0.5}CoO_3$ Ferroelectric Capacitors On Platinized Silicon With No Polarization Fatigue," Appl. Phys. Lett. 64 (20), pp. 2673–2675 (1994) May.

Ramesh et al., "Oriented ferroelectric La–Sr–Co–O/Pb–La–Zr–Ti–O/La–Sr–Co–O Heterostructures on [001] Pt/$SiO_2$ Si Substrates Using A Bismuth Titanate Template Layer," Appl. Phys. Lett. 64, (19), pp. 2511–2513 (May 9, 1994).

* cited by examiner

ORIENTED CONDUCTIVE OXIDE ELECTRODES ON SIO₂/SI AND GLASS

This application is a divisional of Ser. No. 09/320,398 now U.S. Pat. No. 6,312,819, filed on May 26, 1999 by Jia et al.

FIELD OF THE INVENTION

The present invention relates to highly oriented conducting layers on $SiO_2$/Si and glass. This invention was made with government support under Contract No. W-7405-ENG-36 awarded by the U.S. Department of Energy. The government has certain rights in the invention.

BACKGROUND OF THE INVENTION

Conductive electrodes such as ruthenium oxide ($RuO_2$) and lanthanum strontium cobalt oxide ($La_{0.5}Sr_{0.5}CoO_3$ generally referred to as LSCO) have been extensively studied as electrode materials for thin film capacitors in which ferroelectric/paraelectric materials are used as dielectrics. Exemplary structures are shown in the following patents. U.S. Pat. No. 5,519,235 relates to a ferroelectric capacitor heterostructure wherein an amorphous $SiO_2$ surface on a silicon wafer surface is initially primed or coated with a thin layer of titanium, tantalum or titanium dioxide and then coated with a thin layer of a metal such as platinum for the subsequent polycrystalline growth of metallic oxide electrode materials such as LSCO, $RuO_x$, and $SrRuO_3$. U.S. Pat. No. 5,270,298 relates to formation of crystalline metal oxide thin films such as LSCO employing a layered perovskite, such as bismuth titanate (BTO), template layer to initiate c-axis orientation in LSCO and PZT overlayers. Similarly, U.S. Pat. No. 5,248,564 used a layer of BTO on a silicon dioxide layer prior to a layer of LSCO. The interlayers of BTO are c-axis oriented only, i.e., uniaxially oriented.

Conductive $RuO_2$, which has a rutile structure and tetragonal unit cell with a=b=0.44902 nanometers (nm), c=0.31059 nm, has been widely studied recently due to its unique properties compared to other oxide materials. High electrical conductivity, thermal stability, and chemical resistance make $RuO_2$ very attractive in a variety of applications. Amorphous or polycrystalline $RuO_2$ thin films have been deposited on a variety of substrates, such as oxidized silicon ($SiO_2$/Si), silicon (Si), quartz, glass, and magnesium oxide (MgO). Recently, epitaxial $RuO_2$ thin films have been grown on lattice matched substrates such as $LaAlO_3$, yttria-stabilized zirconia (YSZ), YSZISi, and sapphire. The growth of highly textured $RuO_2$ on $SiO_2$/Si is more relevant in electronic devices since $SiO_2$ is almost exclusively used as a field oxide, as a passivation layer, or as an isolation material in silicon-based circuitry. Highly textured $RuO_2$ is preferable for use as electrodes in dielectric thin film capacitors because well oriented electrodes can further enhance the electrical and dielectric properties of dielectric materials. Nevertheless, all the previous $RuO_2$ films deposited on $SiO_2$/Si show polycrystalline or uniaxial normal alignment (random in-plane orientation).

The conductive oxide $La_{0.5}Sr_{0.5}CoO_3$ (LSCO), which has a psuedo-cubic lattice constant of 0.3835 nm and a room temperature resistivity of 90 $\mu\Omega$-cm, has been extensively studied as an electrode material for ferroelectric thin film capacitors, where the dielectric materials can be $PbZr_xTi_{1-x}O_3$ (PZT) or lanthanum-modified PZT. The improved device performance obtained by using LSCO as an electrode material, compared with the use of conventional platinum, has been attributed to the better structural/chemical compatibility and the cleaner interface (less charged defects) between LSCO and the dielectric materials. Fewer oxygen vacancies within the near interface region of the ferroelectric layer may also contribute to superior device performance.

For applications of LSCO films such as electrodes for nonvolatile ferroelectric random access memories (NFRAMs), epitaxial and/or well-textured LSCO films are preferable. The reduced grain-boundary scattering from an epitaxial LSCO film leads to lower resistivity of the film, which is a prerequisite for high frequency applications. As a bottom electrode and/or seed layer for ferroelectric thin film capacitors, well textured LSCO films also induce epitaxial or preferential oriented growth in subsequently deposited ferroelectric films. This is important since a highly oriented ferroelectric layer can produce a larger remnant polarization compared to a randomly oriented ferroelectric layer.

Epitaxial and/or well-textured LSCO films have been grown on $SrTiO_3$, MgO, $LaAlO_3$ and yttria-stabilized zirconia (YSZ). The growth of well-textured LSCO on technically important $SiO_2$/Si is more relevant in microelectronic devices since $SiO_2$ is almost exclusively used as a field oxide, a passivation layer, and/or an isolation material in silicon-based circuitry. Highly oriented LSCO on $SiO_2$/Si has been accomplished by using $Bi_4Ti_3O_{12}$ as a template (see U.S. Pat. No. 5,248,564). Nevertheless, the LSCO films deposited on $SiO_2$/Si by this method show only uniaxial normal alignment with random in-plane orientation. The growth of well-textured or biaxially oriented LSCO films (both normal to and in the film plane) on $SiO_2$/Si has not previously been accomplished.

Improved electric/dielectric properties of $PbZr_xTi_{1-x}O_3$ (PZT), $BaTiO_3$, $SrTiO_3$, and $Ba_xSr_{1-x}TiO_3$ have been observed by using LSCO and/or $RuO_2$ as the electrode materials, as compared to the use of conventional platinum electrodes. Both amorphous and/or polycrystalline thin films of $RuO_2$ or LSCO have been previously deposited on $SiO_2$/Si substrates. The growth of highly oriented or well textured $RuO_2$ and LSCO thin films on $SiO_2$/Si substrates is preferable for electrodes in dielectric thin film capacitors as such highly oriented or well textured electrodes can further enhance the electrical and dielectric properties of subsequently deposited dielectric materials.

Existing technology does not provide highly oriented conductive oxides on substrates such as amorphous $SiO_2$/Si and glass. The difficulties of forming such oriented layers on amorphous or polycrystalline substrates are due to seed growth. A structure of epitaxial $RuO_2$/YSZ/$SiO_2$/Si (with a $SiO_2$ layer greater than 100 nm in thickness) has been previously achieved by additional high temperature processing steps (see U.S. Pat. No. 5,912,068 by Jia for "Epitaxial Oxides on Amorphous $SiO_2$ on Single Crystal Silicon"). Such high processing temperatures (greater than 900° C.) present serious problems for processing on silicon and glass. For example, such a high temperature process cannot be used where there are active devices located on the silicon or where the melting temperature of the substrate is lower than the processing temperature.

It is an object of the present invention to provide a method of forming highly oriented conductive oxides on $SiO_2$/Si substrates, such highly oriented conductive oxides preferably characterized as biaxially oriented.

Another object of the present invention is to provide a low temperature method of forming highly oriented conductive oxides on $SiO_2$/Si substrates.

Another object of the invention is to provide a thin film structure including a thin layer of biaxially oriented YSZ on a SiO$_2$/Si substrate for subsequent deposition of highly oriented conductive oxides, said thin layer of oriented YSZ formed by ion-beam-assisted-deposition (IBAD).

Still another object of the present invention is to provide a thin film structure including a structure of an oriented layer of Ba$_{0.5}$Sr$_{0.5}$TiO$_3$ (BSTO) and/or Ba$_{1-x}$Sr$_x$TiO$_3$ $0 \leq x \leq 1$) on a biaxially oriented layer of RuO$_2$ on an ion-beam-assisted-deposited (IBAD) layer of YSZ on a SiO$_2$/Si substrate.

Yet another object of the present invention is to provide a thin film structure including a structure of a biaxially oriented layer of La$_{0.5}$Sr$_{0.5}$CoO$_3$ on a biaxially oriented layer of CeO$_2$ on an ion-beam-assisted-deposited layer of YSZ on a SiO$_2$/Si substrate.

SUMMARY OF THE INVENTION

To achieve the foregoing and other objects, and in accordance with the purposes of the present invention, as embodied and broadly described herein, the present invention can be summarized as a thin film structure including a silicon substrate having a layer of silicon dioxide on a surface thereof, said silicon dioxide layer having a thickness of at least about 100 nanometers, and a layer of cubic oxide material deposited upon the layer of silicon dioxide by ion-beam-assisted-deposition, said layer of cubic oxide material characterized as biaxially oriented. Preferably, the cubic oxide material is yttria-stabilized zirconia.

The present invention can further include additional thin layers of biaxially oriented ruthenium oxide or lanthanum strontium cobalt oxide upon the layer of yttria-stabilized zirconia. In the case of lanthanum strontium cobalt oxide, an intermediate layer of cerium oxide is situated between the yttria-stabilized zirconia layer and the lanthanum strontium cobalt oxide layer. Also, the present invention can further include a layer of barium strontium titanium oxide upon the layer of biaxially oriented ruthenium oxide or lanthanum strontium cobalt oxide.

In addition to the thin film structures of the present invention, the present invention includes methods of forming such thin film structures, such a method including a low temperature deposition of a layer of a biaxially oriented cubic oxide material upon the silicon dioxide surface of a silicon dioxide/silicon substrate.

DETAILED DESCRIPTION

The present invention is concerned with the formation of highly oriented conductive oxides on SiO$_2$/Si or glass substrates. Also, the present invention is concerned with intermediate substrate structures including biaxially oriented YSZ on SiO$_2$/Si for subsequent deposition of conductive oxides such as ruthenium oxide, lanthanum strontium cobalt oxide and the like.

In one embodiment of the present invention, highly oriented, preferably biaxially oriented, thin film layers of ruthenium oxide (RuO$_2$) or cerium oxide (CeO$_2$) are deposited upon an intermediate substrate structure of IBAD-deposited-YSZ/SiO$_2$/Si. Other materials such as BSTO can then be deposited upon the structure of RuO$_2$/IBAD-deposited-YSZ/SiO$_2$/Si. In another embodiment of the present invention, highly oriented, preferably biaxially oriented, thin films of LSCO are deposited upon an intermediate substrate structure of CeO$_2$/IBAD-deposited-YSZ/SiO$_2$/Si.

By the term "biaxially oriented" is meant alignment along at least two axes (both normal to and in the film plane). The term "biaxially textured" is sometimes used in place of biaxially oriented.

Ion-beam-assisted-deposition (IBAD), a process that is able to deposit biaxially textured thin films on amorphous or polycrystalline substrates, has previously been used to prepare textured buffer layers such as YSZ on polycrystalline metallic substrates for growth of high-temperature superconducting YBa$_2$Cu$_3$O$_{7-x}$ (YBCO) films. See U.S. Pat. No. 5,872,080 wherein the biaxially textured YSZ buffer layer produced by the IBAD is used as a template and subsequent YBCO films are grown by other deposition techniques.

In the present invention, an IBAD-deposited-YSZ layer can serve as a template to grow conductive RuO$_2$ thin films on technically important SiO$_2$/Si (the SiO$_2$ layer at least approximately 100 nm in thickness). Using the intermediate article of an IBAD-deposited-YSZ on a SiO$_2$/Si substrate, subsequently deposited, biaxially oriented RuO$_2$ thin films have been found to have a room-temperature resistivity of 37 micro Ω-cm. Thin films of dielectric Ba$_{0.5}$Sr$_{0.5}$TiO$_3$ (BSTO) were then deposited on the RuO$_2$/IBAD-YSZ/SiO$_2$/Si by pulsed laser deposition. The BSTO had a pure (111) orientation normal to the substrate surface and a dielectric constant above 360 at 100 kHz.

Further, the use of IBAD-deposited-YSZ as a seed layer for subsequent growth of well-textured or biaxially oriented and highly conductive LSCO thin films on technically important SiO$_2$(approximately 100 nm)/Si has now been achieved. The biaxially oriented LSCO thin films deposited at 700° C. on SiO$_2$/Si show metallic resistivity versus temperature characteristics and have a room-temperature resistivity of around 110 $\mu\Omega$-cm. Use of this process to achieve these structures can overcome many technical obstacles to the growth of highly textured electronic materials on SiO$_2$/Si and may yield wide applications for electronic devices with new functionalities.

Figure 4:
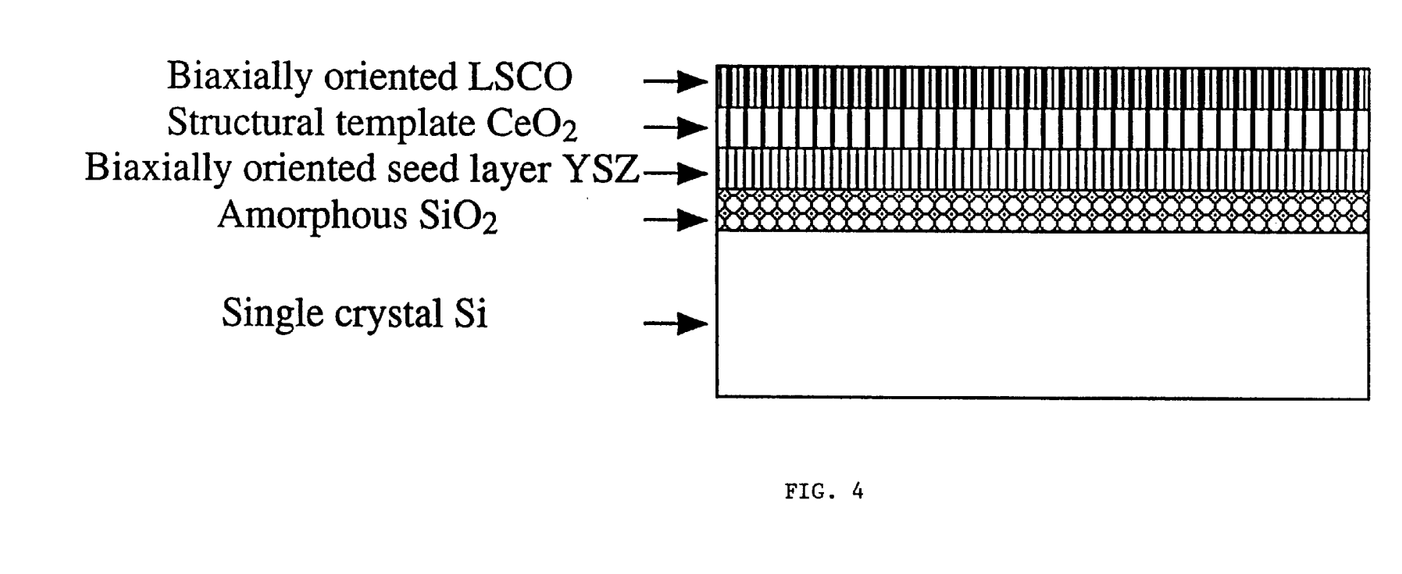
FIG. 4 shows a cross sectional view of a generic structure used to construct one embodiment of a biaxially textured conductive oxide on SiO$_2$/Si.

FIG. 4 shows the schematic illustration of the multilayer structure used to achieve the biaxially oriented LSCO on $SiO_2$/Si. As can be seen from the figure, both a biaxially oriented YSZ (a=0.514 nm) seed layer and a structural template $CeO_2$ (a=0.541 nm) are needed to accomplish the growth of highly oriented LSCO (a=0.384 nm). Here the structural template provides an optimum crystal structure for growth of thin films with desired textures. Efforts to grow LSCO films directly on biaxially oriented YSZ (IBAD-deposited-YSZ) resulted in (110) oriented films. This result is similar to LSCO films grown on single crystal YSZ substrates.

It is not necessary to have a $CeO_2$ interlayer for growth of highly textured $RuO_2$ thin films on IBAD-deposited-YSZ. Epitaxial $RuO_2$ thin films with (h00) orientation normal to the substrate can be deposited directly on single crystal YSZ.

Another significant result of the present invention is the use of the low processing temperatures. Though the LSCO films discussed above were processed at 700° C., the present technique can be easily extended to much lower processing temperatures, e.g., from about 450° C. to about 650° C. Biaxially oriented LSCO films have been successfully deposited on glass substrates at deposition temperatures of about 600° C.

The biaxially oriented cubic oxide material can be yttria-stabilized zirconia (YSZ) or may be magnesium oxide and the like. Preferably, the biaxially oriented cubic oxide material is yttria-stabilized zirconia.

The present invention is more particularly described in the following examples, which are intended as illustrative only, since numerous modifications and variations will be apparent to those skilled in the art.

The structural properties of films were characterized by x-ray diffraction (XRD) on a Siemens D5000 four circle diffractometer with Cu Kα radiation and by scanning electron microscopy on a JEOL JSM-6300 FXV field emission scanning microscope. The resistivity and the residual resistivity ratio ($RRR=\rho_{300K}/\rho_{4.2K}$) of thin films were measured using a standard four-probe technique. $RuO_2$ films were patterned by ion-milling. LSCO thin films were patterned by chemical etching with a 1% phosphoric acid solution. The bridge was typically 500 μm in width and 2.5–7.5 mm in length. Gold contact pads were deposited by rf sputtering after patterning the $RuO_2$ or LSCO films. To assure a good contact between the LSCO and gold, the finished structure was annealed at 400° C. in oxygen for two hours. The dielectric properties of BSTO thin films were characterized with a GenRad 1689 Precision RLC DigiBridge.

EXAMPLE 1

Single-crystal boron doped silicon wafers with resistivities of 1–5 Ω-cm and (100) orientations were used as substrates. The substrates were ultrasonically cleaned in acetone, methanol, and deionized water. The native oxide on the silicon surface was removed by $HF:H_2O$ (1:10) before thermally growing a 500 nm thick $SiO_2$ layer in dry oxygen at 1050° C. After $SiO_2$ growth, ion beam assisted deposition (IBAD) was used to deposit biaxially textured yttria-stabilized zirconia (YSZ) at room temperature on the amorphous $SiO_2$. It should be noted that the IBAD-YSZ layer is used only as a template (and not as a diffusion barrier) for subsequent growth of highly textured $RuO_2$. The thick $SiO_2$ serves as both an effective passivation layer for the silicon crystal and as a diffusion barrier between $RuO_2$ and silicon.

Conductive $RuO_2$ and dielectric BSTO thin forms were deposited by pulsed laser deposition (PLD) in another chamber. The PLD technique used a 308 nm XeCl excimer laser and operated at repetition rates of 2–10 Hz, producing 20 nanosecond (ns) pulses with an energy density of 2 joules per square centimeter ($J/cm^2$). The substrate temperature and oxygen pressure were optimized at 700° C. and 0.5 mTorr, respectively, for deposition of $RuO_2$. The nominal film thickness for $RuO_2$ was 120–150 nm. The deposition conditions for BSTO were also optimized to obtain both a highly crystalline film and a minimal chemical reaction at the $BSTO/RuO_2$ interface, as needed for capacitors. The typical thickness of the BSTO films was 350–450 nm.

Figure 1:
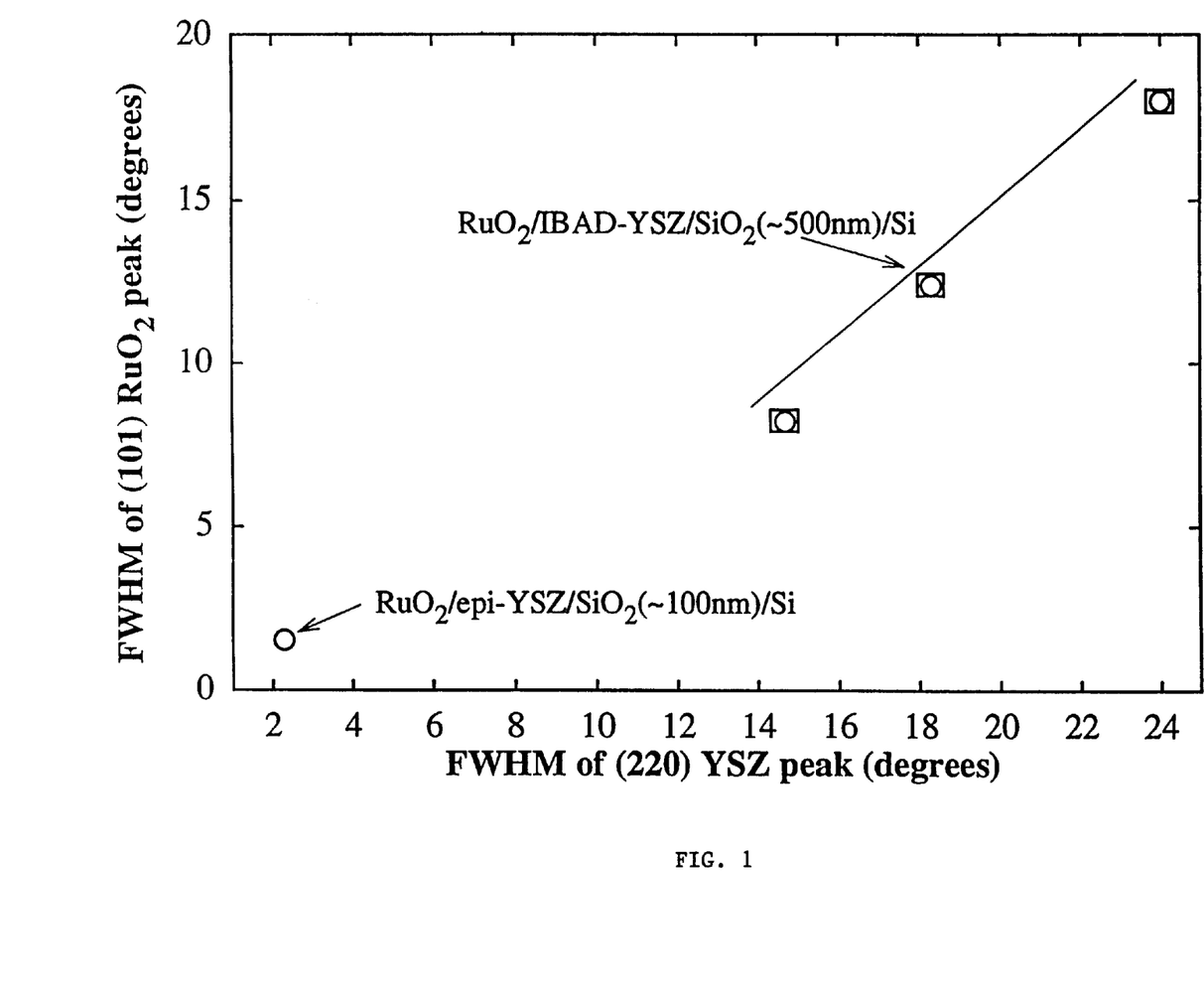
FIG. 1 shows dependence of FWHM of (101) RuO$_2$ peak on FWHM of (220) IBAD-YSZ peak.

The XRD 2θ-scan on $RuO_2$/IBAD-YSZ/$SiO_2$/Si showed that the $RuO_2$ was purely (200) oriented normal to the substrate surface. The full width at half maximum (FWHM) of an ω-rocking curve on the $RuO_2$ (200) reflection was near 3.7°, compared with a value of less than 1.5° for $RuO_2$ on epitaxial YSZ/Si. The in-plane orientation of the $RuO_2$ film is a strong function of the IBAD-YSZ quality as shown in FIG. 1. Here the FWHM values of the φ-scans from (220) YSZ were used as a measure of IBAD-YSZ quality. It is clear that the narrower the peaks in the φ-scan on (220) IBAD-deposited-YSZ, the better is the IBAD-YSZ biaxial texture, and the better the crystallinity of the $RuO_2$ layer. Also, the FWHM values from (101) $RuO_2$ are always 5~6° smaller than those of IBAD-YSZ layers. It is believed that the top IBAD-YSZ layer has a smaller FWHM value than that measured by the XRD φ-scan because the FWHM value evaluated from XRD reflects the volume average from the whole film thickness. This has been confirmed not only by our experiments but also by others. For comparison, data from epitaxial $RuO_2$ on YSZ/$SiO_2$/Si (a structure of YSZ/$SiO_2$/Si is formed at a temperature above 950° C.) are also included in FIG. 1.

Figure 2:
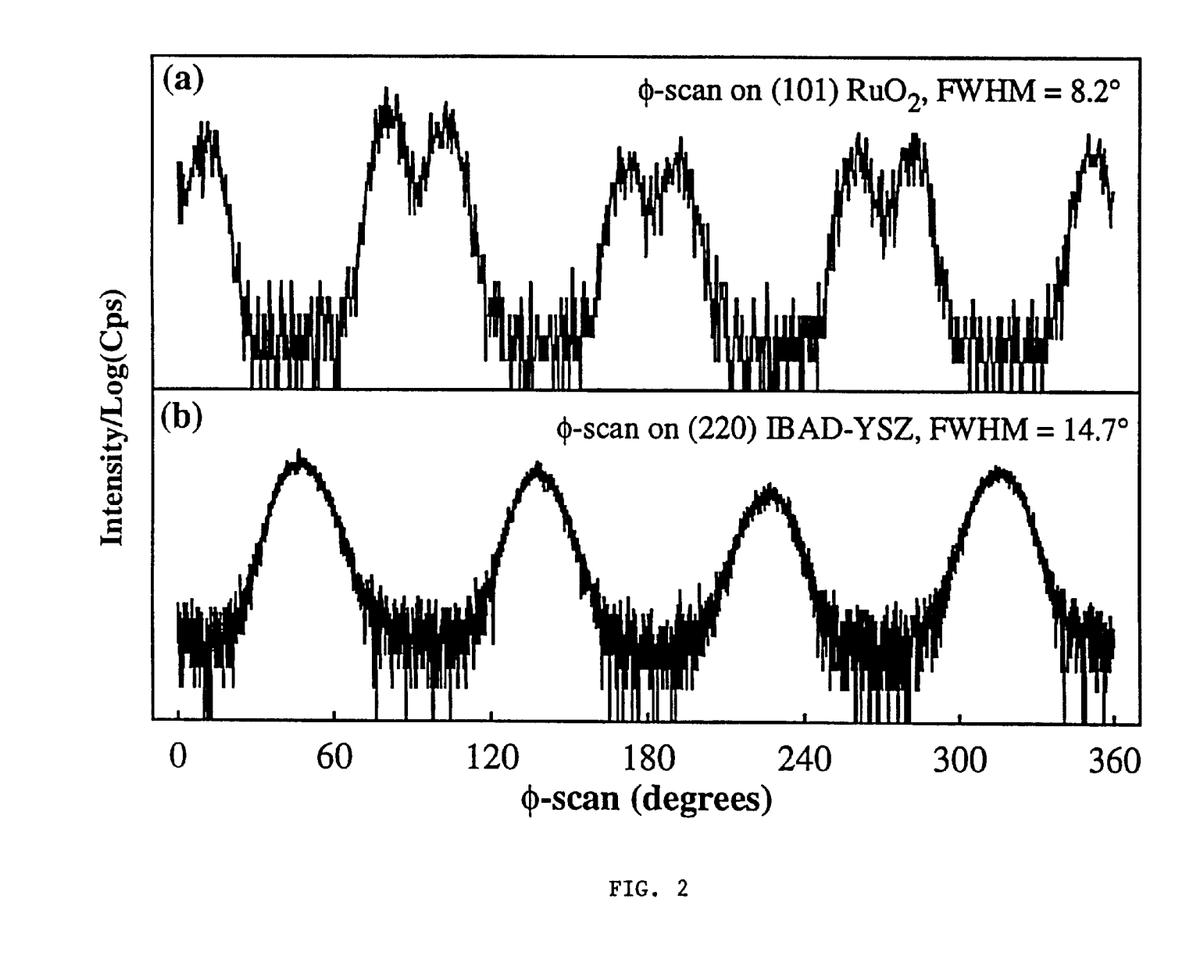
FIG. 2 shows x-ray diffraction φ-scans for a RuO$_2$ film on IBAD-YSZ on a SiO$_2$/Si substrate taken on the (101) reflection of RuO$_2$ (a), and the (220) reflection of YSZ (b).
Figure 3:
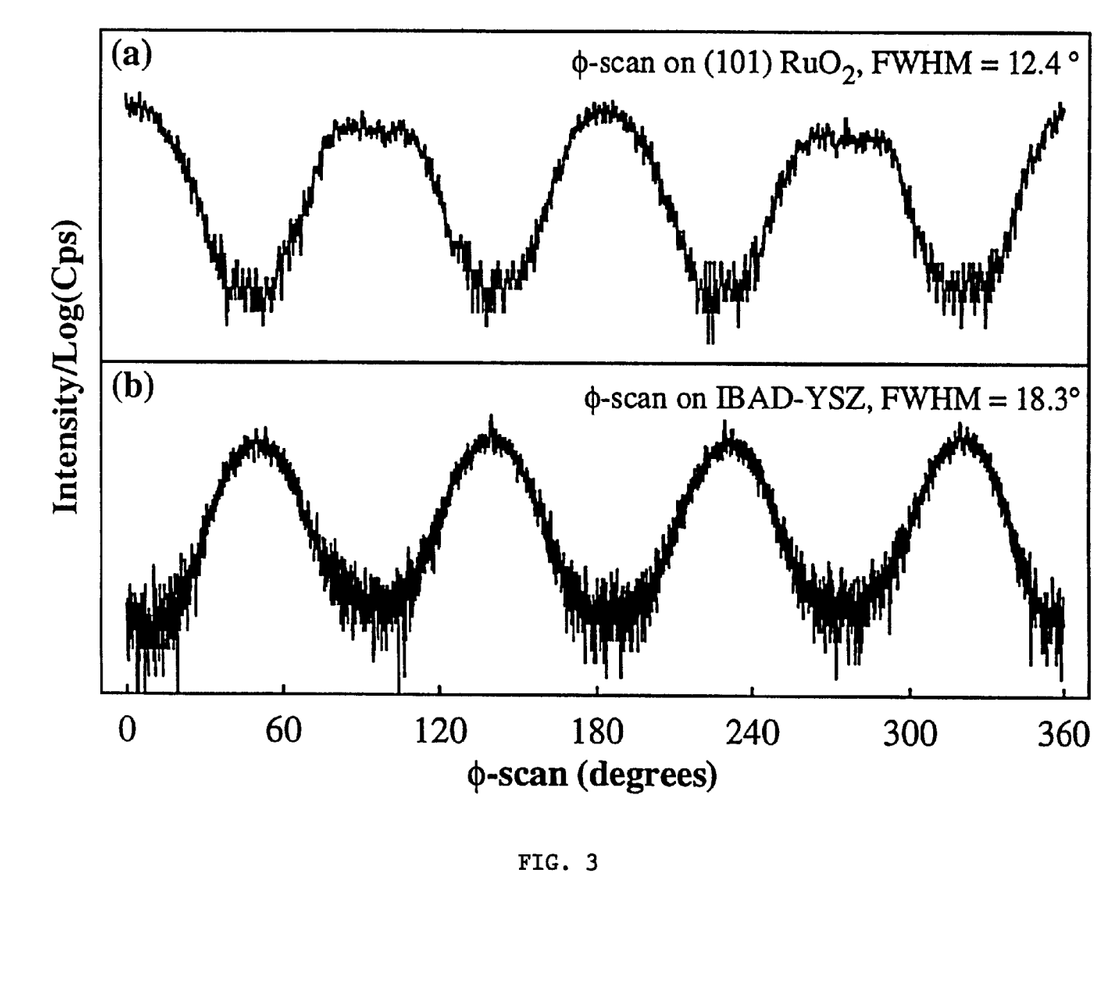
FIG. 3 shows x-ray diffraction φ-scans for a RuO$_2$ film on IBAD-YSZ on a SiO$_2$/Si substrate taken on the (101) reflection of RuO$_2$ (a), and the (220) reflection of YSZ (b).

FIGS. 2 and 3 show the details of φ-scans from (101) $RuO_2$ and (220) IBAD-YSZ from two different samples of $RuO_2$/IBAD-YSZ/$SiO_2$/Si, where the IBAD-YSZ layers have FWHM values of 14.7° and 18.3°, respectively. The separation of two nearest peaks from the φ-scans of (101) $RuO_2$ is a direct indication of degeneracy of the $RuO_2$ (101) peaks from a diagonal-type alignment for $RuO_2$ on YSZ. These peaks merge together when the FWHM value of the IBAD-YSZ increases to about 18°.

From a four-probe resistivity measurement, the electrical resistivity of biaxially oriented $RuO_2$ on IBAD-YSZ/$SiO_2$/Si, which is in the range of 37 ±2 μΩ-cm, is not a strong function of FWHM value of IBAD-YSZ, where $RuO_2$ thin films are all deposited at 700° C. This value is comparable to that of single crystal bulk $RuO_2$. However, the residual resistivity ratio (RRR) of the $RuO_2$ films increases slightly with decreasing FWHM values of the IBAD-YSZ. A RRR of 2.5 for $RuO_2$ on IBAD-YSZ/$SiO_2$/Si can be compared with values of between 1 and 2 for polycrystalline $RuO_2$ thin films deposited by other techniques, above 5 from epitaxial $RuO_2$, and above 20 for bulk single-crystal $RuO_2$. It is well-known that RRR depends upon the degree of thin film perfection, impurities, and/or defect density. The reduced grain boundary scattering and the relatively large grain size (150 nm×80 nm on average based on scanning electron microscopy measurement) from the biaxially textured $RuO_2$ film might contribute to the relatively large RRR compared to polycrystalline $RuO_2$ films.

BSTO films deposited on biaxially oriented $RuO_2$ on $SiO_2$/Si have a pure (111) orientation. This is quite different from BSTO films on other bottom electrodes, such as platinum, indium-tin oxide, $SrRuO_3$, and $YBa_2Cu_3O_{7-x}$, where the BSTO diffraction peaks exhibit a mixture of (110), (111), and (100), pure (110), or pure (100). On the other hand, BSTO thin films deposited on polycrystalline $RuO_2$/TiN reveal a mixture diffraction peaks of (110), (111) and (200). The dielectric constant of the BSTO on biaxially oriented $RuO_2$ is over 360 at 100 kHz. This value is lower than that of the epitaxial BSTO on $SrRuO_3$ on $LaAlO_3$ or of BTSO on $YBa_2Cu_3O_{7-x}$, on MgO. Nevertheless, it is much higher than that of randomly oriented BSTO on other bottom electrodes. The dielectric loss, which monotonically decreases with increasing frequency from 100 Hz to 100 kHz, is around 0.05 at 100 kHz with zero bias.

It has been shown that biaxially oriented $RuO_2$ thin films can be deposited on $SiO_2$/Si by using IBAD-YSZ as a template. The degree of in-plane alignment of $RuO_2$ is directly related to the quality of IBAD-YSZ. The smaller the value of full width at half maximum of the (220) IBAD-YSZ peak, the closer the diagonal-type alignment between $RuO_2$ and YSZ. The electrical resistivity, on the other hand, is not a strong function of the microstructure of $RuO_2$ films. Nevertheless, high crystallinity enhances the residual resistivity ratio of the films due to the reduced grain boundary scattering effects.

The successful accomplishment of highly textured $RuO_2$ on $SiO_2$/Si can lead to high performance devices such as high dielectric constant and/or ferroelectric thin film capacitors on technically important $SiO_2$/Si substrates. Importantly, the relatively low processing temperatures used to form highly oriented oxide films on $SiO_2$/Si makes it possible to integrate high performance thin film components with active devices on silicon substrates.

EXAMPLE 2

Single-crystal boron doped silicon wafers were cleaned and oxidized and coated with a layer of biaxially textured YSZ as in Example 1.

Both a structural template film of $CeO_2$ and conductive LSCO thin films were deposited by PLD as in Example 1. PLD was performed at an energy density of 2 $J/cm^2$ and at repetition rates of 2–5 Hz. The $CeO_2$ film, with a thickness of about 20 nm, was deposited at about 700° C. and at an oxygen pressure of 200 mTorr. The oxygen pressure for LSCO deposition was optimized at about 400 mTorr. The substrate temperature was varied from about 600° C. to about 700° C. depending upon the substrate selected using 600° C. for substrates such as IBAD-YSZ/glass and 700° C. for substrates such as IBAD-YSZ/$SiO_2$/Si. The thickness of the LSCO films was about 200 nm.

Figure 5:
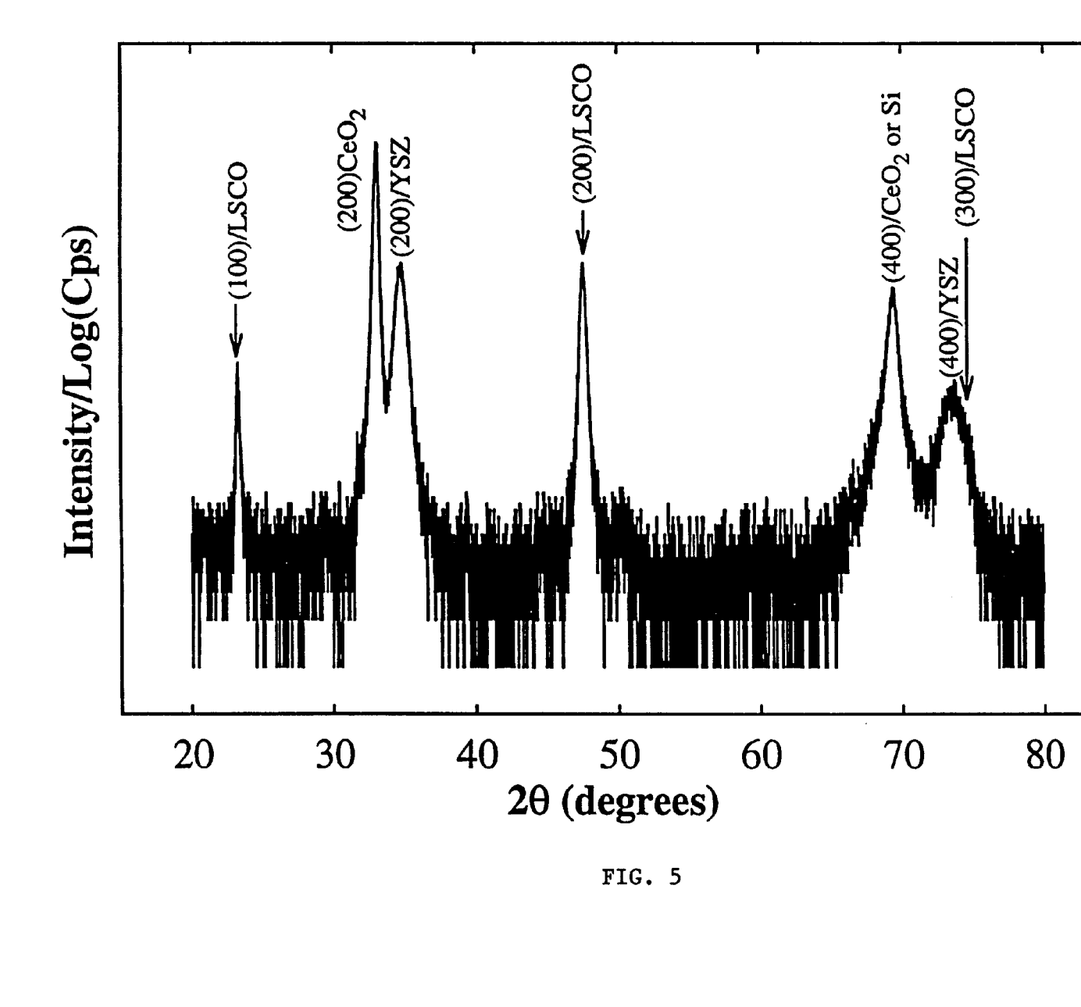
FIG. 5 shows an x-ray diffraction 2θ-scan for a LSCO film on SiO$_2$/Si including both a biaxially oriented YSZ seed layer and a CeO$_2$ structural template layer between the LSCO and amorphous silicon dioxide.

The LSCO deposited on a very thin intermediate $CeO_2$ layer on biaxially oriented YSZ on $SiO_2$/Si showed only (100) diffraction peaks from a XRD θ-2θ scan. The growth of (100) oriented LSCO has great technical significance since highly conductive LSCO with (100) orientation is preferable for application as electrodes for ferroelectric thin film capacitors. FIG. 5 shows the XRD θ-2θ scan for a LSCO film on $SiO_2$/Si. The rocking curve from the (200) peak has a full width at half maximum (FWHM) of less than 4° compared with a value of 0.7° for LSCO on a single crystal YSZ substrate with a $CeO_2$ structural template.

Figure 6:
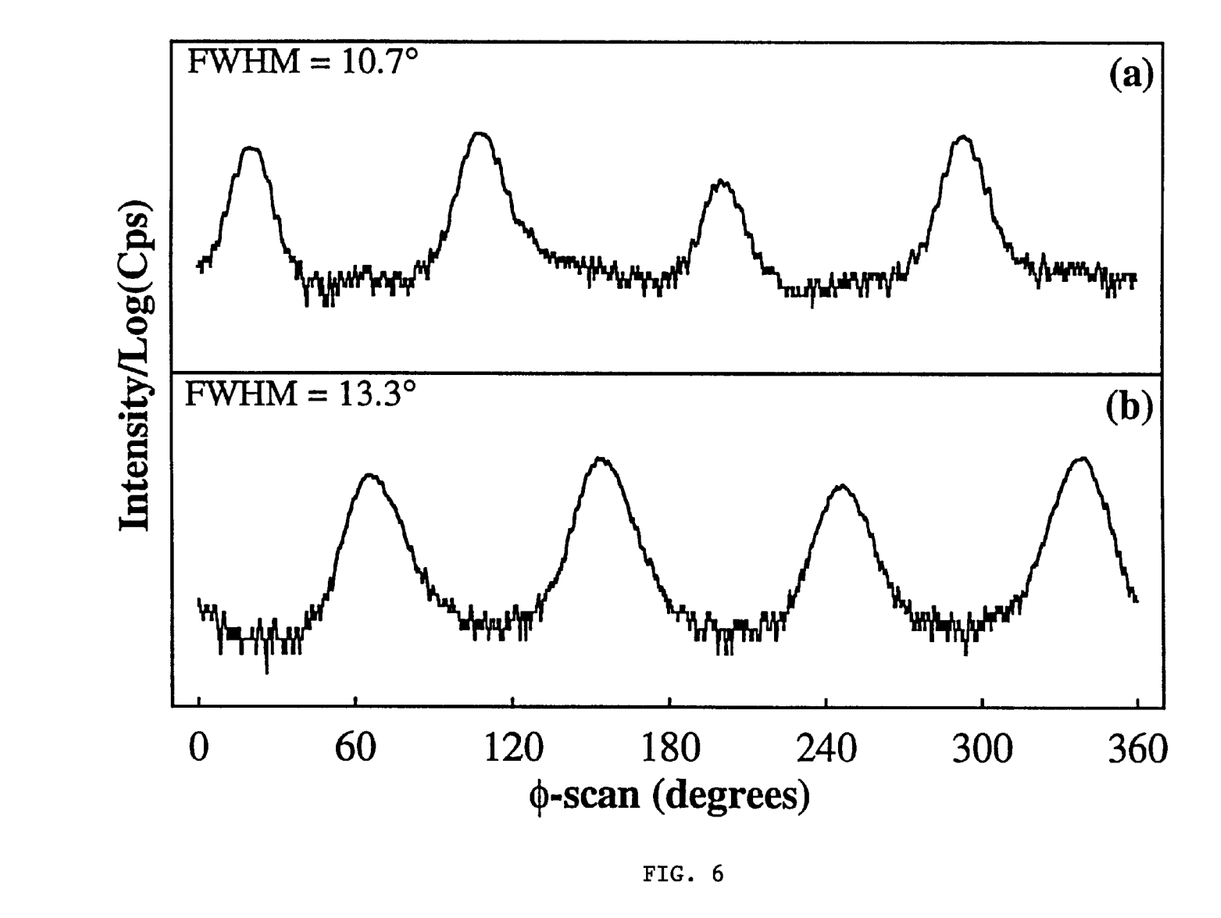
FIG. 6 shows x-ray diffraction φ-scans for a LSCO film on biaxially oriented YSZ on a SiO$_2$/Si substrate taken on the (110) reflection of LSCO (a), and the (220) reflection of YSZ (b).
Figure 7:
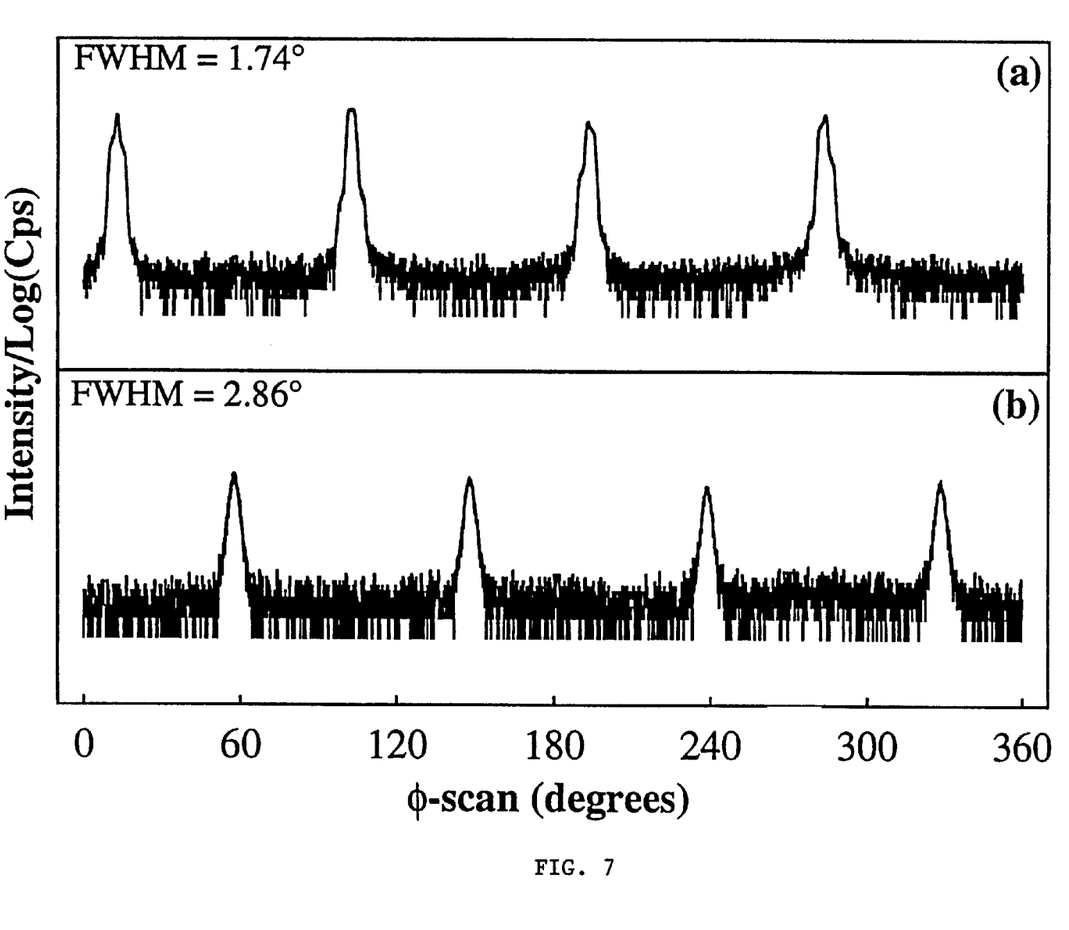
FIG. 7 shows x-ray diffraction φ-scans for a LSCO film on single crystal YSZ taken on the (110) reflection of LSCO (a), and the (220) reflection of YSZ (b).

The measured results demonstrate that biaxially oriented LSCO thin films on an underlying $SiO_2$/Si substrate have been accomplished by use of the IBAD-deposited-YSZ layer and the $CeO_2$ layer. This is a substantial improvement over prior art LSCO thin films where a uniaxial alignment was obtained on $SiO_2$/Si substrates by using $Bi_4Ti_3O_{12}$ as a template. As shown in FIG. 6, φ-scans from 0 to 360° show only four peaks 90° apart for both the LSCO (a) and biaxially oriented YSZ (b). The peak positions are 45° apart for the LSCO and YSZ layers, indicating a 45° rotation between the basal plane of LSCO and that of YSZ. This is an expected result considering the lattice parameters of LSCO, $CeO_2$, and YSZ. As a comparison, FIG. 7 shows the φ-can of a LSCO film on a single crystal YSZ with $CeO_2$ as a buffer layer. The only difference between FIGS. 6 and 7 is a relatively large FWHM value for the LSCO on IBAD-YSZ/$SiO_2$/Si as compared to LSCO on single crystal YSZ. The nature of in-plane texture is the same and shows no difference at all. It should be noted that the degree of in-plane alignment or orientation of LSCO is directly related to the quality of the IBAD-deposited-YSZ film. The smaller the FWHM value for the IBAD-deposited-YSZ (220) diffraction peak, the higher the crystallinity of the LSCO film. A FWHM value of 7.5° is obtained for LSCO on a $SiO_2$/Si substrate where the underlying IBAD-deposited-YSZ layer has a FWHM value of 11.1° from the (220) diffraction peak. In contrast, the FWHM value of the (220) reflection for LSCO on single crystal YSZ is 1.5° where the (220) YSZ reflection has a FWHM value of 0.44°.

Figure 8:
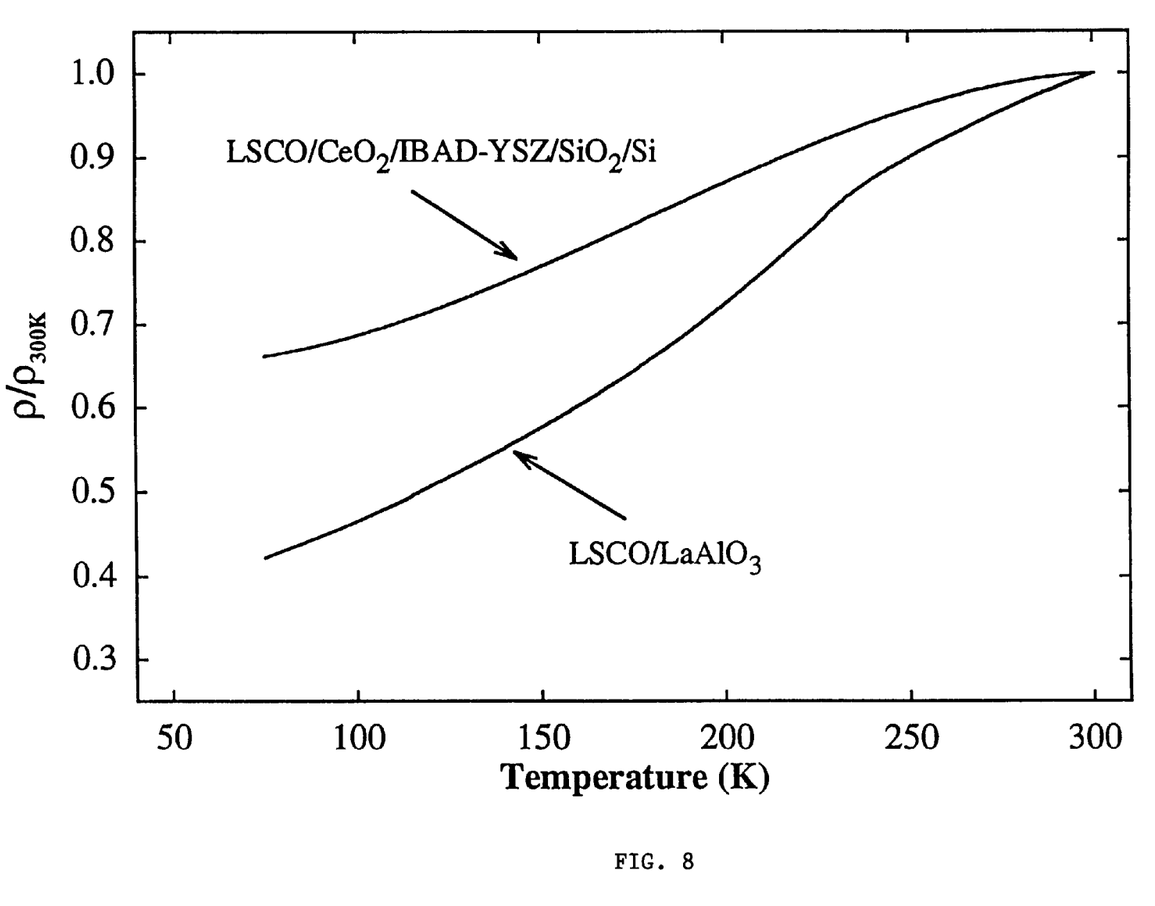
FIG. 8 shows the normalized resistivity versus temperature characteristics of an epitaxial LSCO film on LaAlO$_3$ and a biaxially oriented LSCO film on SiO$_2$/Si.

Room temperature electrical resistivity of the biaxially oriented LSCO thin films deposited at 700° C. on the $SiO_2$/Si substrates was measured as about 110 $\mu\Omega$-cm which is very close to values for epitaxial LSCO films on single crystal substrates such as $LaAlO_3$ (a=0.3793 nm). $LaAlO_3$ has a very good lattice match with LSCO. FIG. 8 shows the resistivity versus temperature (normalized to the room temperature resistivity) of LSCO films deposited at 700° C. on different substrates. Both films show metallic behavior except for the difference in the temperature coefficient of resistivity (TCR) for the films. The room temperature resistivity, however, is basically the same with a value of around 110 $\mu\Omega$-cm. This value is comparable to sintered ceramic LSCO indicating, along with the metallic nature of the resistivity versus temperature characteristic, that oxygen deficiency in these films is not significant. It has been reported that LSCO films change from a metallic to an insulating behavior depending upon their oxygen content. On the other hand, a film with high crystallinity has a higher TCR, i.e., the resistivity depends more on temperature. This is expected as LSCO films with better structural properties and lower defect densities exhibit less grain boundary scattering of carriers and therefore enhanced temperature dependent electrical conductivity. Electrical resistivity of the LSCO films is dependent upon the substrate temperature during the deposition on $SiO_2$/Si with IBAD-deposited-YSZ as a seed layer.

Figure 9:
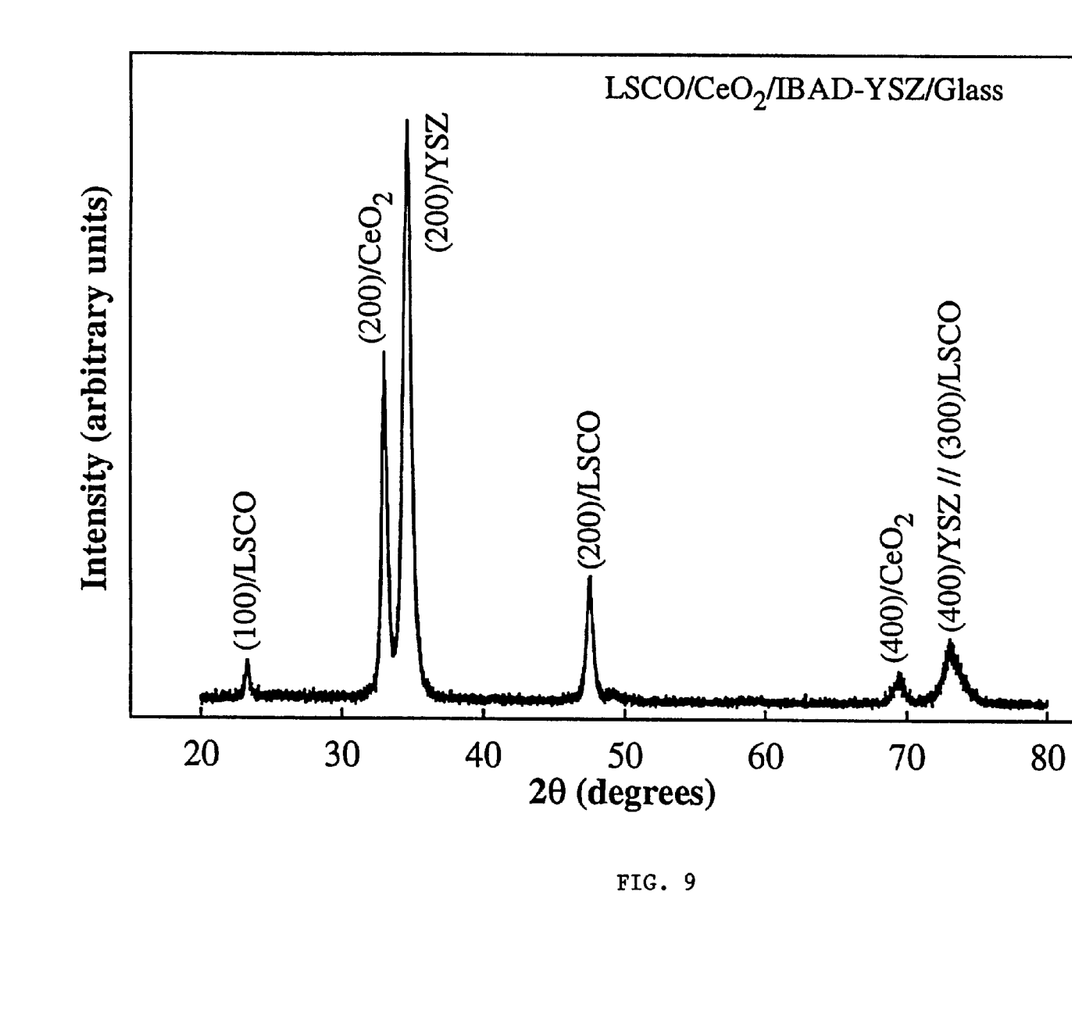
FIG. 9 shows an x-ray diffraction 2θ-scan for a LSCO film on Corning 1737 glass.

Though the LSCO films of this example were processed at 700° C., the present technique can be easily extended to much lower processing temperatures, e.g., from about 450° C. to about 650° C. Biaxially oriented LSCO films have been successfully deposited on glass substrates at deposition temperatures of about 600° C. FIG. 9 shows the XRD 2θ-scans of a LSCO film on Corning 1737 glass with $CeO_2$/IBAD-deposited-YSZ as a buffer layer. The film shows not only (100) orientation normal to the film plane but also demonstrates good in-plane orientation. The XRD φ-scan spectra of LSCO (220) diffraction are similar to the data presented in FIG. 6 except for a slightly larger FWHM value of the diffraction peak.

Thus, it has been shown that biaxially oriented LSCO thin films can be grown on the technically important $SiO_2$/Si substrates that are commonly used in microelectronic devices. To deposit (100) oriented LSCO thin films on amorphous $SiO_2$ with in-plane alignment, a biaxially textured YSZ seed layer prepared by IBAD and a structural template $CeO_2$ layer are first formed on a $SiO_2$/Si substrate.

An important feature of this invention is the low processing temperatures and reasonably good film texturing quality. A room temperature electrical resistivity of around 110 $\mu\Omega$-cm for the biaxially oriented LSCO thin films deposited at 700° C. on $SiO_2$/Si is found to be very close to the epitaxial LSCO films on single crystal $LaAlO_3$ substrates.

EXAMPLE 3

Dielectric BSTO films were deposited by PLD on $RuO_2$/IBAD-deposited-YSZ/$SiO_2$/Si substrates and LSCO/$CeO_2$/IBAD-deposited-YSZ/$SiO_2$/Si substrates. The substrate temperature during deposition was maintained at 680° C. in order to obtain highly crystalline films and to minimize chemical reactions at the BSTO/electrode interface. The thickness of each BSTO film was from about 350 nm to 450 nm.

Figure 10:
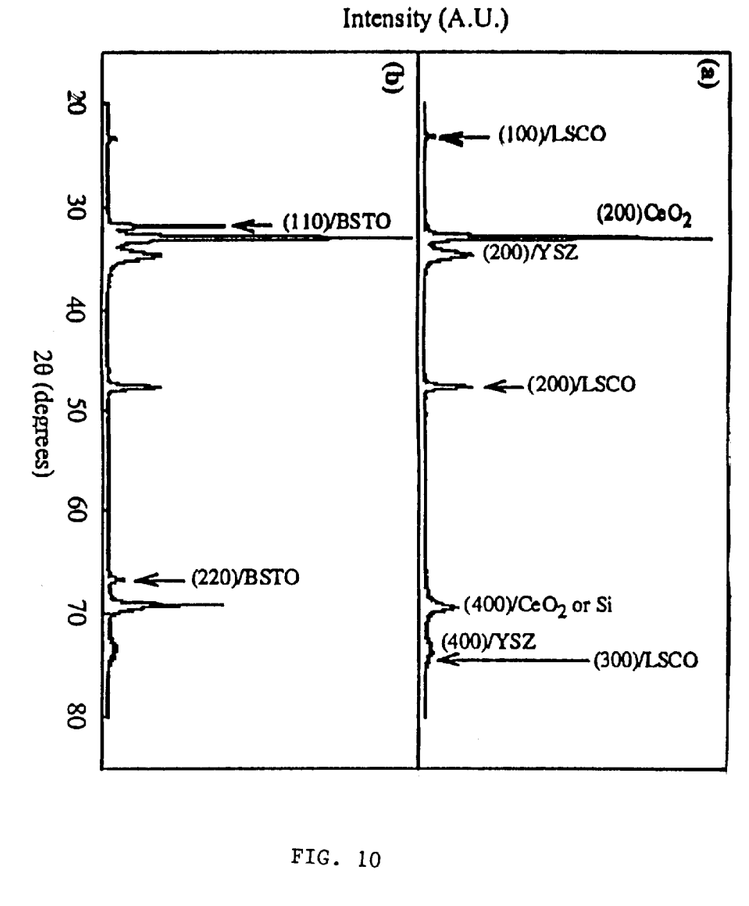
FIG. 10 shows x-ray diffraction 2θ-scans for a LSCO film on SiO$_2$/Si including both a biaxially oriented YSZ seed layer and a CeO$_2$ structural template layer between the LSCO and amorphous silicon dioxide and for a BSTO film on LSCO/CeO$_2$/IBAD-deposited-YSZ/SiO$_2$/Si.

The BSTO films deposited on biaxially oriented $RuO_2$ layers on IBAD-deposited-YSZ/$SiO_2$/Si substrates have a pure (111) orientation. Such an orientation is also observed for BSTO on epitaxial $RuO_2$ electrodes. The BSTO films deposited on biaxially oriented LSCO layers on $CeO_2$/IBAD-deposited-YSZ/$SiO_2$/Si substrates have a (110) orientation as shown in FIG. 10. As a comparison, LSCO films on electrodes of platinum, indium-tin oxide, strontium-ruthenium oxide and yttrium-barium-copper oxide show a mixture of diffraction peaks of (110), (111), and (100), pure (110), or pure (100).

Although the present invention has been described with reference to specific details, it is not intended that such details should be regarded as limitations upon the scope of the invention, except as and to the extent that they are included in the accompanying claims.

What is claimed is:

1. A method of forming thin film structures including a biaxially oriented layer of a conductive oxide upon a silicon substrate having a layer of silicon dioxide on a surface thereof, said silicon dioxide layer having a thickness of at least about 100 nanometers, said method comprising:

depositing a layer of a cubic oxide material by ion-beam-assisted-deposition upon said silicon dioxide layer, where said layer of cubic oxide material exhibits biaxial orientation;

subsequently depositing a biaxially oriented layer of a conductive oxide upon the cubic oxide material, and, depositing a layer of barium strontium titanium oxide upon the biaxially oriented conductive oxide layer.

* * * * *